United States Patent
Koo et al.

(10) Patent No.: US 10,718,824 B2
(45) Date of Patent: Jul. 21, 2020

(54) APPARATUS AND METHOD FOR CHECKING INDUCTOR

(71) Applicant: SAMSUNG ELECTRO-MECHANICS CO., LTD., Suwon-si, Gyeonggi-do (KR)

(72) Inventors: Gun Woo Koo, Suwon-si (KR); Hwan Soo Lee, Suwon-si (KR); Jong Woo Han, Suwon-si (KR)

(73) Assignee: SAMSUNG ELECTRO-MECHANICS CO., LTD., Suwon-si, Gyeonggi-Do (KR)

(*) Notice: Subject to any disclaimer, the term of this patent is extended or adjusted under 35 U.S.C. 154(b) by 122 days.

(21) Appl. No.: 16/020,859

(22) Filed: Jun. 27, 2018

(65) Prior Publication Data

US 2019/0195935 A1     Jun. 27, 2019

(30) Foreign Application Priority Data

Dec. 27, 2017  (KR) .......................... 10-2017-0180925

(51) Int. Cl.
| | | |
|---|---|---|
| *G01R 31/06* | (2006.01) | |
| *G01R 31/72* | (2020.01) | |
| *G01R 27/08* | (2006.01) | |
| *G01R 31/01* | (2020.01) | |

(52) U.S. Cl.
CPC ............. *G01R 31/72* (2020.01); *G01R 27/08* (2013.01); *G01R 31/013* (2013.01)

(58) Field of Classification Search
CPC ............................... G01R 31/06; G01R 31/346
See application file for complete search history.

(56) References Cited

U.S. PATENT DOCUMENTS

| | | | | |
|---|---|---|---|---|
| 2006/0022679 A1* | 2/2006 | Obata | .................. | G01R 31/346 324/551 |
| 2008/0090519 A1* | 4/2008 | Rofougaran | ......... | H04B 5/0075 455/41.1 |
| 2017/0122995 A1* | 5/2017 | Voisine, Jr. | ............... | G01K 7/16 |

FOREIGN PATENT DOCUMENTS

| | | |
|---|---|---|
| JP | 2006-064515 A | 3/2006 |
| JP | 4635249 B2 | 2/2011 |
| JP | 2012-242377 A | 12/2012 |
| KR | 10-1700808 B1 | 1/2017 |

OTHER PUBLICATIONS

Korean Notice of Reasons for Rejection dated Oct. 29, 2018 issued in Korean Patent Application No. 10-2017-0180925 (with English translation).

* cited by examiner

*Primary Examiner* — Tung X Nguyen
(74) *Attorney, Agent, or Firm* — Morgan, Lewis & Bockius LLP

(57) ABSTRACT

An apparatus for checking an inductor includes a detector outputting a detection signal including information corresponding to a parallel resistance component of a checking target inductor; and a determiner receiving the detection signal and determining whether the checking target inductor is satisfactory based on a magnitude of the parallel resistance component.

11 Claims, 4 Drawing Sheets

APPARATUS AND METHOD FOR CHECKING INDUCTOR

CROSS-REFERENCE TO RELATED APPLICATION(S)

This application is based on and claims the benefit of priority to Korean Patent Application No. 10-2017-0180925 filed on Dec. 27, 2017 in the Korean Intellectual Property Office, the disclosure of which is incorporated herein by reference in its entirety.

TECHNICAL FIELD

The present disclosure relates to an apparatus and method for checking an inductor capable of determining whether the inductor has deteriorated.

BACKGROUND

Inductors are widely used in various devices as basic electric/electronic devices. Recently, according to the trend for higher performance and slimness of the devices, an inductor, as an element mounted on a device, is required to have a high degree of reliability. Therefore, it is very important to check characteristics of such an inductor, such as deterioration of the inductor, before being delivered to a customer or mounted on an actual product.

SUMMARY

An aspect of the present disclosure may provide an apparatus for checking an inductor capable of determining whether an inductor has deteriorated.

Another aspect of the present disclosure may provide a method for checking an inductor, capable of determining whether an inductor has deteriorated.

According to an aspect of the present disclosure, an apparatus for checking an inductor may include a detector configured to output a detection signal including information corresponding to a parallel resistance component of a target inductor; and a determiner configured to receive the detection signal and determining whether the target inductor is satisfactory based on a magnitude of the parallel resistance component.

The determiner may determine that the target inductor is satisfactory when the magnitude of the parallel resistance component is equal to or greater than a first reference value and determine that the target inductor is unsatisfactory when the magnitude of the parallel resistance component is lower than a second reference value that is equal to or less than the first reference value.

The detector may apply an impulse voltage to one end of the target inductor, receive a response signal from another end of the target inductor, and additionally outputs the response signal.

The determiner may compare the response signal with a reference signal which is an impulse response signal of the target inductor in a good state and determine whether the target inductor is satisfactory in further consideration of a comparison result.

The determiner may determine a magnitude of the impulse voltage in consideration of a change in magnitude of a parallel resistance component before and after an application of an impulse signal of the same type of inductors as the target inductor.

The detector may be implemented by at least one processor and a memory, and the determiner may be implemented by at least one processor and a memory and communicatively connected to the detector.

According to another aspect of the present disclosure, a method for checking an inductor may include detecting a magnitude of a parallel resistance component of a target inductor; and determining whether the target inductor is satisfactory based on the magnitude of the parallel resistance component.

The determining may include determining that the target inductor is satisfactory when the magnitude of the parallel resistance component is equal to or greater than a first reference value and determining that the target inductor is unsatisfactory when the magnitude of the parallel resistance component is lower than a second reference value that is equal to or less than the first reference value.

The method may further include: applying an impulse voltage to one end of the target inductor and receiving a response signal output at another end of the target inductor; and comparing the response signal with a reference signal which is an impulse response signal of the target inductor in a good state and additionally determining whether the target inductor is satisfactory in consideration of a comparison result.

The method may further include determining a magnitude of the impulse voltage in consideration of a change in magnitude of a parallel resistance component before and after an application of an impulse signal of the same type of inductors as the target inductor.

The determining may include determining a breakdown voltage of the same type of inductors; determining test voltages based on the breakdown voltage; applying each of impulse signals having the test voltage to each of the same type of inductors, and determining a variation of a magnitude of the parallel resistance component of each of the same type of inductors before the impulse signal is applied and a variation of a magnitude of the parallel resistance component of the same type of inductors after the impulse signal is applied; and determining a highest test voltage among the test voltages having variations equal to or less than a reference variation as the magnitude of the impulse voltage.

BRIEF DESCRIPTION OF DRAWINGS

The above and other aspects, features, and advantages of the present disclosure will be more clearly understood from the following detailed description taken in conjunction with the accompanying drawings, in which.

DETAILED DESCRIPTION

Hereinafter, exemplary embodiments in the present disclosure will now be described in detail with reference to the accompanying drawings.

Figure 1:
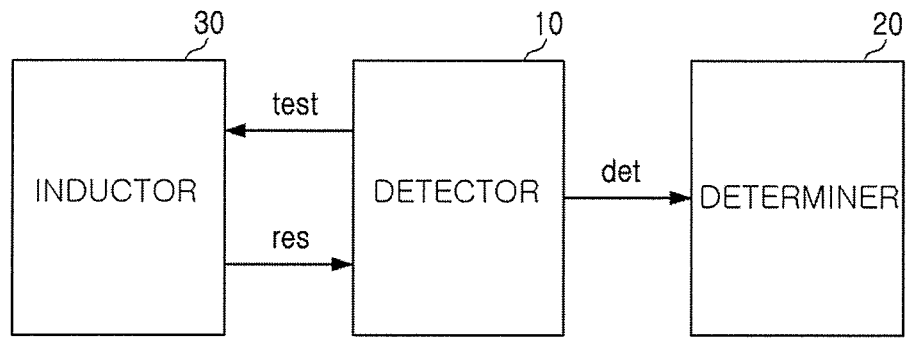
FIG. 1 is a schematic diagram of a configuration of an apparatus for checking an inductor according to an exemplary embodiment in the present disclosure.

FIG. 1 is a schematic diagram of a configuration of an apparatus for checking an inductor according to an exemplary embodiment in the present disclosure. The apparatus for checking an inductor according to an exemplary embodiment in the present disclosure may include a detector 10 and a determiner 20.

The detector 10 may apply a test signal test to an inductor 30 and receive a response signal res from the inductor 30. For example, the detector 10 may apply an impulse signal having a predetermined voltage to one end of the inductor 30 as the test signal test, and receive an impulse response signal output to the other end of the inductor 30 as the response signal res. Alternatively, the detector 10 may apply the test signal test that is an alternating current signal to both ends of the inductor 30, and receive a current flowing through the inductor 30 and/or a voltage of both ends of the inductor 30 as the response signal res.

Further, the detector 10 may output a detection signal det including information about a parallel resistance component. For example, the detector 10 may analyze the response signal res to extract the parallel resistance component of the inductor 30 and output the detection signal det including information about the parallel resistance component. Alternatively, the detector 10 may output the response signal res as the detection signal det.

The determiner 20 may determine whether the inductor 30 deteriorates based on the detection signal det. For example, the determiner 20 may determine a magnitude of the parallel resistance component of the inductor 30 based on the detection signal det and compare the magnitude of the parallel resistance component with a reference value to determine whether the inductor 30 deteriorates, in particular, whether the inductor 30 has a suitable withstand voltage (for example, a breakdown voltage (BDV)).

Also, the determiner 20 may determine the magnitude of the impulse signal applied to the inductor 30 for checking of the inductor 30 or the like.

An equivalent circuit of the inductor 30 may be represented to include a serial resistor and a serial inductor connected in series with each other, and a parallel resistor connected in parallel with the serial resistor and the serial inductor. In an exemplary embodiment in the present disclosure, the parallel resistor of the inductor 30 is a parallel resistor when the inductor 30 is represented as the equivalent circuit and means resistance components that are seen as being connected between both ends of the inductor 30 within the inductor 30.

The detector 10 and the determiner 20 each may include at least one processing unit and a memory. Here, the processing unit may include a central processing unit (CPU), a graphics processing unit (GPU), a microprocessor, an application specific integrated circuit (ASIC), a field programmable gate array (FPGA), etc. and may have a plurality of cores. The memory may be a volatile memory (e.g., RAM, etc.), a non-volatile memory (e.g., ROM, flash memory, etc.), or a combination thereof.

Also, each of the detector 10 and the determiner 20 may include additional storage. Storage may include, but is not limited to, magnetic storage, optical storage, and the like. The storage may store computer readable instructions for implementing a method for checking an inductor according to an exemplary embodiment in the present disclosure, and may also store other computer readable instructions for implementing an operating system, an application program, and the like. The computer readable instructions stored in the storage may be loaded into memory for execution by the processing unit.

Further, each of the detector 10 and the determiner 20 may include an input device(s) and an output device(s). Here, the input device(s) may include, for example, a keyboard, a mouse, a pen, a voice input device, a touch input device, an infrared camera, a video input device or any other input device. The output device(s) may also include, for example, one or more displays, speakers, printers, or any other output device. Further, each of the detector 10 and the determiner 20 may use an input device or an output device provided in another device as the input device(s) or the output device(s).

Further, each of the detector 10 and the determiner 20 may further include a communication module performing communications with another device. The communication module that may be included in the detector 10 and the determiner 20 is implemented with various electronic circuits to perform various functions, for example, noise filtering, A/D conversion, encoding/decoding and modulating.

Figure 2:
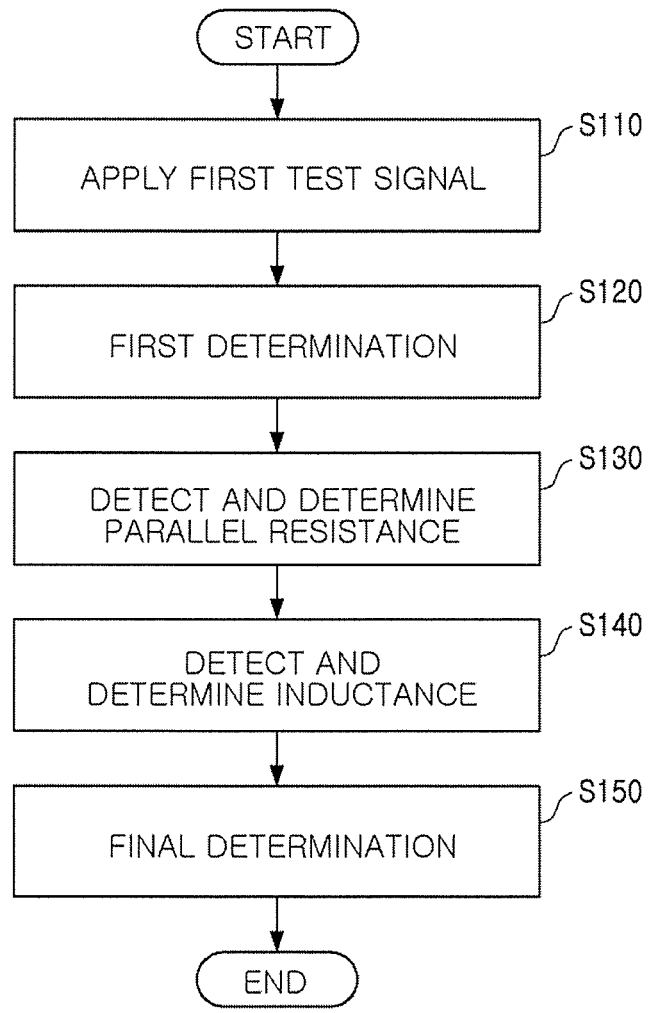
FIG. 2 is a flowchart illustrating a method for checking an inductor according to an exemplary embodiment in the present disclosure.

FIG. 2 is a flowchart illustrating a method for checking an inductor according to an exemplary embodiment in the present disclosure. Each step illustrated in FIG. 2 may be performed by the detector (10 in FIG. 1) and/or the determiner (20 in FIG. 1).

Referring to FIGS. 1 and 2, the method for checking the inductor according to an exemplary embodiment in the present disclosure will now be described.

First, a first test signal may be applied to the inductor 30 (step S110). The first test signal may be an impulse signal having a predetermined voltage.

Next, a response signal of the inductor 30 to the first test signal may be analyzed to primarily determine whether the inductor 30 is in a satisfactory state (step S120). For example, when the first test signal applied in step S110 is an impulse signal, in step S120, a state of the inductor 30 may be determined by comparing a reference signal, which is an impulse response signal of the inductor 30 that the inductor 30 in a steady state must have and the response signal to the first test signal of the inductor 30 that is being checked. Specifically, each characteristic may be compared after comparing a shape of the response signal of the inductor 30 or an area of a waveform of the response signal, or a peak voltage with the reference signal or converting each of the response signal of the inductor 30 and the reference signal through a mathematical conversion techniques (for example, laplacian).

Next, the magnitude of the parallel resistance component of the inductor 30 may be detected, and it may be determined whether the inductor 30 is in a satisfactory state based on the magnitude of the parallel resistance component (step S130). Specifically, when the magnitude of the parallel resistance component is equal to or greater than a first reference value, it may be determined that the inductor 30 is satisfactory. When the magnitude of the parallel resistance component is less than a second reference value which is equal to or less than the first reference value, it may be determined that the inductor 30 is defective. At this time, the magnitude of the parallel resistance component of the inductor 30 may be changed according to an operating frequency of the inductor 30. According to an exemplary embodiment in the present disclosure, a largest value of the magnitude of the parallel resistance component may be compared with the first reference value and the second reference value.

When the parallel resistance component of the inductor 30 is too small, it is highly likely to consequently determine a path of the current flowing through the inductor 30 by the parallel resistance component of the inductor 30. Therefore, when the parallel resistance component of the inductor 30 is small, it may be confirmed that the current flows into a parallel resistance path, and an inductance decreases.

Actually, as a result of measuring the breakdown voltage (BDV) with respect to winding inductors having a maximum value of the parallel resistance component Rp of magnitude of 4500 ohm (Ω) or more and less than 4000 ohm (Ω), results may be obtained as illustrated in Table 1 below.

TABLE 1

| Rp | BDV average (V) | BDV minimum (V) | BDV maximum (V) | BDV standard deviation |
|---|---|---|---|---|
| 4500Ω or more | 180.5 | 145 | 217 | 17.5 |
| less than 4000Ω | 156.9 | 42 | 202 | 32.7 |

Also, as a result of measuring the breakdown voltage (BDV) with respect to thin film inductors having the maximum value of the parallel resistance component Rp of magnitude of 1350 ohm (Ω) or more and less than 1250 ohm (Ω), results may be obtained as illustrated in Table 2 below.

TABLE 2

| Rp | BDV average (V) | BDV minimum (V) | BDV maximum (V) | BDV standard deviation |
|---|---|---|---|---|
| 1350Ω or more | 200.6 | 160 | 220 | 14.1 |
| less than 1250Ω | 181.2 | 89 | 215 | 25.8 |

Referring to the experimental results, it may be seen that a correlation is established between the parallel resistance component and the breakdown voltage.

That is, according to an exemplary embodiment in the present disclosure, it may be possible to know whether the inductor 30 is in a satisfactory state, that is, whether the inductor 30 has an appropriate breakdown voltage, by using the magnitude of the parallel resistance component.

Next, it may be determined whether the inductance of the inductor 30 has an appropriate value (step S140). That is, it may be determined whether the inductance of the inductor 30 has a value within an error range.

Next, a final determination may be made based on the results of steps S120, S130 and S140 (step S150). That is, when it is determined that the inductor 30 is satisfactory in all steps of S120, S130, and S140, it may be determined that the checked target inductor is satisfactory.

Figure 3:
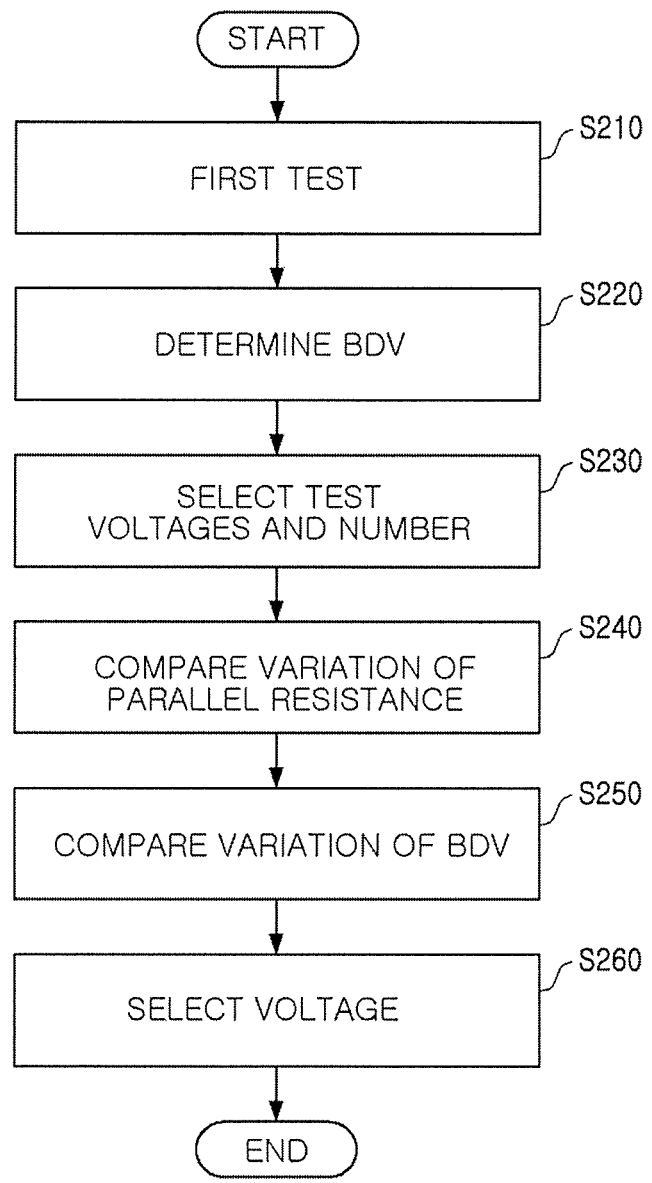
FIG. 3 is an operation flowchart for explaining a method of determining magnitude of an impulse signal as a first test signal in a method for checking an inductor according to an exemplary embodiment in the present disclosure.

FIG. 3 is an operation flowchart for explaining a method of determining magnitude of an impulse signal as a first test signal in a method for checking an inductor according to an exemplary embodiment in the present disclosure. Respective steps illustrated in FIG. 3 may be performed by the detector (10 in FIG. 1) and/or the determiner (20 in FIG. 1).

Figure 4A:
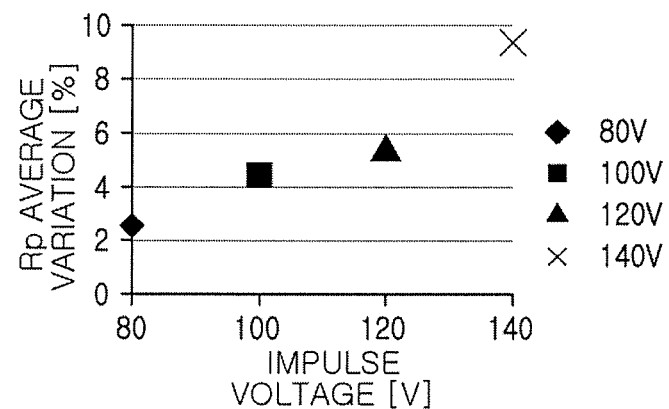
FIGS. 4A to 5B are reference diagrams for explaining a method of determining magnitude of an impulse signal as a first test signal in a method for checking an inductor according to an exemplary embodiment in the present disclosure.
Figure 4B:
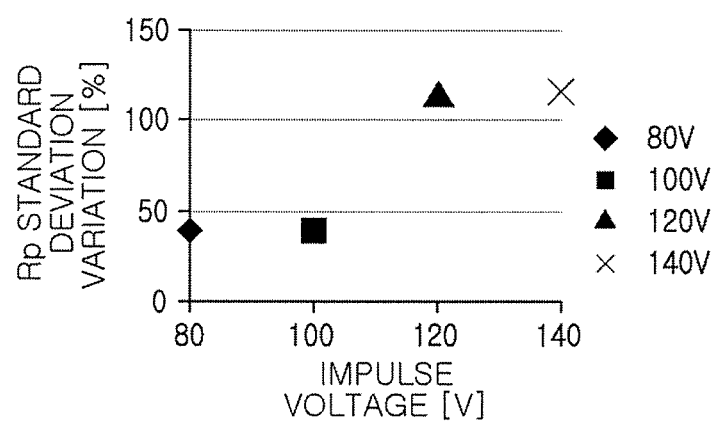
Figure 5A:
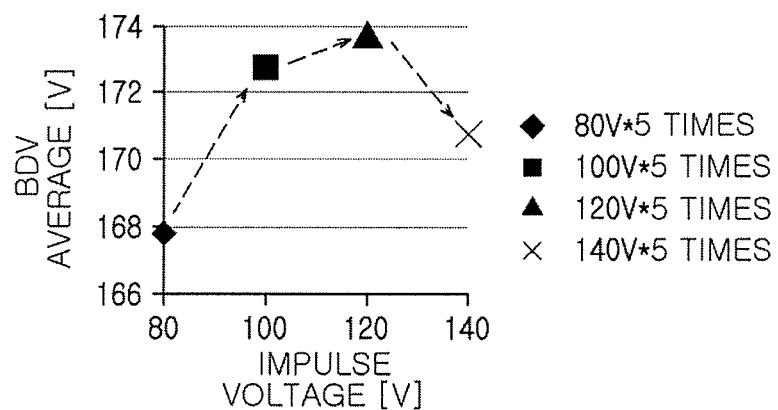
Figure 5B:
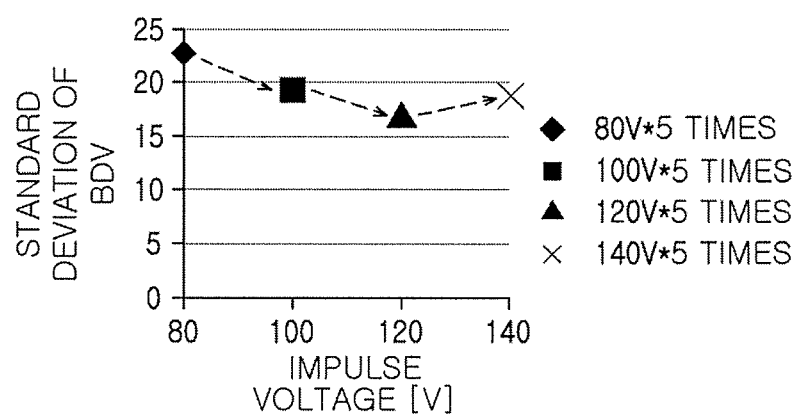

FIGS. 4A to 5B illustrate reference diagrams for explaining a method of determining magnitude of an impulse signal as a first test signal in a method for checking an inductor according to an exemplary embodiment in the present disclosure. FIG. 4A illustrates a variation of a parallel resistance component when an impulse voltage is applied. FIG. 4B illustrates a variation of a standard deviation of a parallel resistance component when an impulse voltage is applied. FIG. 5A illustrates a variation of an average value of a breakdown voltage when an impulse voltage is applied. FIG. 5B illustrates a variation of a standard deviation of a breakdown voltage when an impulse voltage is applied.

Referring to FIGS. 1, 3, and 4A through 5B, a method of determining the magnitude of the impulse signal in the method for checking an inductor according to an exemplary embodiment in the present disclosure will be described.

First, a first test may be performed (step S210). In step S210, some or all of the steps illustrated in FIG. 2 may be performed. That is, the first test is a test for selecting inductors to be used for determining the magnitude of the impulse voltage. In step S210, inductors having a satisfactory state are selected, and the size of an impulse voltage is determined using the selected inductors, and thus the reliability of determining the impulse voltage is increased.

Next, as a result of performing step S210, the breakdown voltage may be measured using inductors having the satisfactory state (step S220).

Next, test voltages may be determined according to the result of the determination in step S220, and simultaneously the number of tests may be determined (step S230). For example, the test voltages may be selected as voltages that are 80%, 70%, 60%, and 50% of the breakdown voltage measured in step S220. Also, in step S230, the impulse voltage may be applied to a plurality of inductors by the number of tests determined for each of the determined test voltages.

Next, for each of the plurality of inductors, a change in magnitude of the parallel resistance component after and before the application of the impulse voltage may be reviewed (step S240).

Further, for each of the plurality of inductors, a change in magnitude of the breakdown voltage before and after the application of the impulse voltage may be reviewed (step S250).

Hereinafter, it is assumed that as a result of the determination in step S230, the breakdown voltage is 170 V and as a result of performing the steps S240 and S250, results as illustrated in FIGS. 4A, 4B, 5A, and 5B are obtained.

Referring to FIG. 4A, the variation of the parallel resistance is not large until an impulse voltage of 120V (that is, about 70% of the breakdown voltage) is applied. However, it may be seen that when an impulse voltage of 140V (that is, about 80% of the breakdown voltage) is applied, the variation of the parallel resistance is large.

Further, referring to FIG. 4B, the standard deviation of the parallel resistance is not large until an impulse voltage of 100 V (that is, about 60% of the breakdown voltage) is applied. However, it may be seen that when the impulse voltage of 120V (that is, about 70% of the breakdown voltage) is applied, the standard deviation of the parallel resistance is large.

Referring to FIG. 5A, the breakdown voltage gradually increases until the impulse voltage of 120V (that is, about 70% of the breakdown voltage) is applied. However, it may be seen that when the impulse voltage of 140V (that is, about 80% of the breakdown voltage) is applied, the breakdown voltage is greatly reduced.

Further, referring to FIG. 5B, the standard deviation of the breakdown voltage decreases slightly until the impulse voltage of 120V (that is, about 70% of the breakdown voltage) is applied. However, it may be seen that when the impulse voltage of 140V (that is, about 80% of the breakdown voltage) is applied, the standard deviation of the breakdown voltage becomes large.

The magnitude of the impulse voltage to be used for the test may be determined using the results of steps S240 and S250 (step S260). For example, considering a characteristic of the breakdown voltage more importantly, 120V (i.e., about 70% of the breakdown voltage) may be determined as the magnitude of the impulse voltage, and considering the variation of the parallel resistance more importantly, 100V (i.e., about 60% of the breakdown voltage) may be determined as the magnitude of the impulse voltage.

The magnitude of the impulse voltage as the first test signal applied in step S110 of FIG. 2 may be determined according to the magnitude of the impulse voltage determined in step S260.

As set forth above, an apparatus and method for checking an inductor according to an exemplary embodiment in the present disclosure may easily and accurately identify whether the deterioration of the inductor, in particular, the withstand voltage characteristic of the inductor, is satisfactory.

While exemplary embodiments have been shown and described above, it will be apparent to those skilled in the art that modifications and variations could be made without departing from the scope in the present disclosure as defined by the appended claims.

What is claimed is:

1. An apparatus for checking an inductor, the apparatus comprising:
   a detector configured to output a detection signal including information corresponding to a parallel resistance component of a target inductor; and
   a determiner configured to receive the detection signal and determine whether the target inductor is satisfactory based on a magnitude of the parallel resistance component,
   wherein the detector applies an impulse voltage to one end of the target inductor and receives a response signal from another end of the target inductor.

2. The apparatus of claim 1, wherein the determiner determines that the target inductor is satisfactory when the magnitude of the parallel resistance component is equal to or greater than a first reference value and determines that the target inductor is unsatisfactory when the magnitude of the parallel resistance component is lower than a second reference value that is equal to or less than the first reference value.

3. The apparatus of claim 1, wherein the detector additionally outputs the response signal to the determiner.

4. The apparatus of claim 3, wherein the determiner compares the response signal with a reference signal which is an impulse response signal of the target inductor in a good state and determines whether the target inductor is satisfactory in further consideration of a comparison result.

5. The apparatus of claim 3, wherein the determiner determines a magnitude of the impulse voltage in consideration of a change in magnitude of a parallel resistance component before and after an application of an impulse signal of the same type of inductors as the target inductor.

6. The apparatus of claim 1, wherein the detector is implemented by at least one processor and a memory, and the determiner is implemented by at least one processor and a memory and communicatively connected to the detector.

7. A method for checking an inductor, the method comprising steps of:
   detecting a magnitude of a parallel resistance component of a target inductor;
   determining whether the target inductor is satisfactory based on the magnitude of the parallel resistance component; and
   applying an impulse voltage to one end of the target inductor and receiving a response signal output at another end of the target inductor.

8. The method of claim 7, wherein the step of determining includes: determining that the target inductor is satisfactory when the magnitude of the parallel resistance component is equal to or greater than a first reference value and determining that the target inductor is unsatisfactory when the magnitude of the parallel resistance component is lower than a second reference value that is equal to or less than the first reference value.

9. The method of claim 7, further including steps of:
   comparing the response signal with a reference signal which is an impulse response signal of the target inductor in a good state; and
   additionally determining whether the target inductor is satisfactory in consideration of a comparison result.

10. The method of claim 9, further including a step of deciding a magnitude of the impulse voltage in consideration of a change in magnitude of a parallel resistance component before and after an application of an impulse signal of the same type of inductors as the target inductor.

11. The method of claim 10, wherein the step of deciding includes:
   determining a breakdown voltage of the same type of inductors;
   deciding test voltages based on the breakdown voltage;
   applying each of impulse signals having the test voltage to each of the same type of inductors, and detecting a variation of a magnitude of the parallel resistance component of each of the same type of inductors before the impulse signal is applied and a variation of a magnitude of the parallel resistance component of the same type of inductors after the impulse signal is applied; and
   deciding a highest test voltage among the test voltages having variations equal to or less than a reference variation as the magnitude of the impulse voltage.

* * * * *